United States Patent [19]

Beldavs

[11] Patent Number: 4,573,105
[45] Date of Patent: Feb. 25, 1986

[54] PRINTED CIRCUIT BOARD ASSEMBLY AND METHOD FOR THE MANUFACTURE THEREOF

[75] Inventor: Vitauts Beldavs, Indianapolis, Ind.

[73] Assignee: RCA Corporation, Princeton, N.J.

[21] Appl. No.: 466,912

[22] Filed: Feb. 16, 1983

[51] Int. Cl.[4] .......................... H05K 7/10; H05K 3/20
[52] U.S. Cl. ........................................ 361/403; 29/831
[58] Field of Search .................. 361/400, 403, 418; 29/831, 832, 837, 840, DIG. 1; 156/901, 514

[56] References Cited

U.S. PATENT DOCUMENTS

| | | | |
|---|---|---|---|
| 3,390,308 | 6/1968 | Marley | 361/387 |
| 3,919,602 | 11/1975 | Kaiser et al. | 361/400 |
| 4,139,881 | 2/1979 | Shimizu et al. | 361/400 |
| 4,143,456 | 3/1979 | Inoue | 29/588 |
| 4,164,778 | 8/1979 | Sawairi et al. | 361/409 |
| 4,312,692 | 1/1982 | Ikeda et al. | 29/831 X |

OTHER PUBLICATIONS

IBM Tech. Discl. Bull., vol. 22, No. 10, 3/80, Coombs et al.
IBM Tech. Discl. Bull., vol. 14, No. 12, 5/72, Goldman.

*Primary Examiner*—Vit W. Miska
*Attorney, Agent, or Firm*—Birgit E. Morris; Edward J. Sites

[57] ABSTRACT

Leadless electronic components are secured to the bottom surface of a printed circuit board in a manner so as to prevent or substantially reduce the displacement of the leadless components prior to or during mass soldering. The technique used to improve the bonding of the leadless components is comprised of a series of steps. Initially, holes are formed through the circuit boards at the positions where it is desired to mount leadless components. A hardenable adhesive is then applied at each of the holes where a leadless component is to be mounted. The amount of adhesive which is applied to each hole is at least sufficient to form a bond with the dielectric body of the leadless component and also to extend partially into the hole formed in the printed circuit board. The leadless components are then brought into contact with the adhesive so as to form an adhesive plug which is bonded to the dielectric body of the leadless component and also to extend into the hole formed in the board. The adhesive is then allowed to harden. The resulting hardened adhesive plug then both mechanically and adhesively holds the leadless components in place through mass soldering of the component to the circuit board.

3 Claims, 15 Drawing Figures

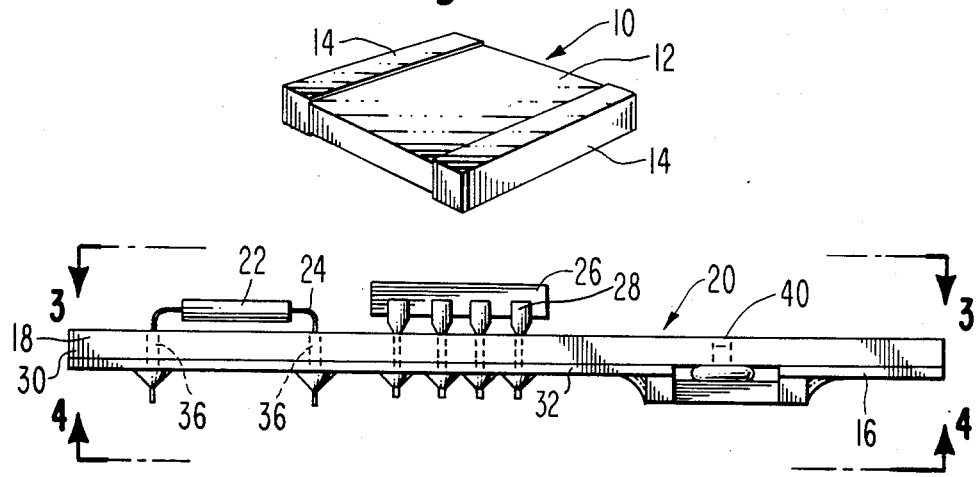
Fig. 1
Fig. 2
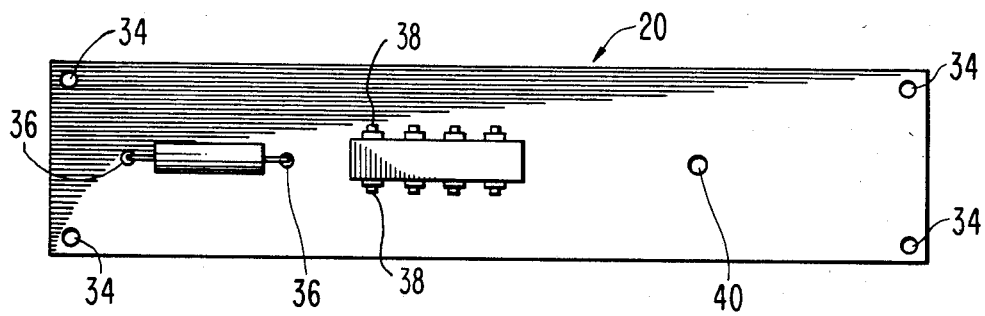
Fig. 3
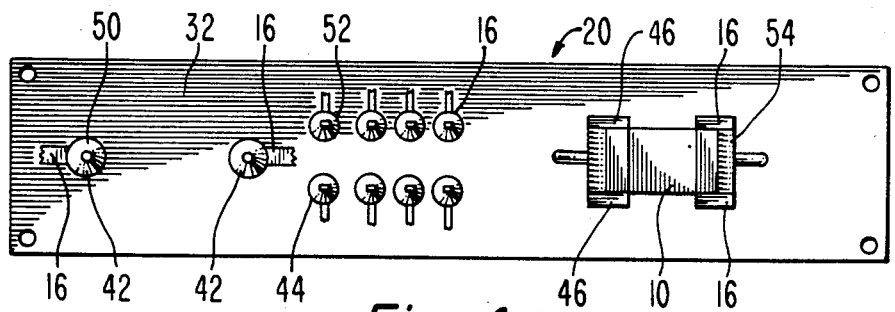
Fig. 4

PRINTED CIRCUIT BOARD ASSEMBLY AND METHOD FOR THE MANUFACTURE THEREOF

This invention relates to a printed circuit board assembly having leadless electronic components and to the method for the manufacture thereof.

BACKGROUND OF THE INVENTION

Printed circuit board assemblies are comprised of a printed circuit board and electronic components which are positioned on and electrically connected to circuitry formed on the printed circuit board. Printed circuit boards as manufactured have a continuous foil of conductive material adhered to at least one of the surfaces of a core of a dielectric material. The continuous conductive foil on the printed circuit board is thereafter patterned using conventional techniques to remove portions of the conductive material so as to form a predetermined circuit pattern. Holes are punched or drilled through the circuit boards at predetermined locations with the holes generally being in registration with selected solder pads formed as part of the circuit pattern etched in the conductive foil. Electronic components are then mounted at predetermined locations on the printed circuit board. The electronic components are temporarily secured in position until they can be permanently soldered in place.

The type of electronic components which have heretofore been generally employed are referred to as leaded components. The electronic elements of the leaded component are encapsulated in a dielectric casing with leads extending from the casing for connecting the component to the circuitry of a printed circuit board. The leads can be in various forms such as wires, pins, legs or the like. When manufacturing printed circuit board assemblies using leaded components, the components are mounted on the surface of the board opposite the side on which the circuitry is normally formed and the leads of the components are inserted through the preformed holes in the printed circuit board. If gravity is not sufficient to hold the leaded components in place, a weight can be placed on the leaded components; the leads of the components can be bent to prevent movement of the components or an adhesive can be used to hold the leaded components in place. After the leaded components are inserted into the printed circuit boards, the leads thereof can be mass soldered to the circuitry of the printed circuit board by methods such as dip soldering or wave soldering. Mass soldering of leaded components is a relatively straight forward process in that the leaded components are mounted on the top surface of the printed circuit board, which does not enter the solder bath, while the bottom surface having the circuitry defined thereon with the leads in registration with solder pads is immersed in the solder bath for soldering.

Recently, there has been developed a new class of electronic components referred to as leadless components. The leadless components differ from the leaded components in that the electronic elements thereof are encased in a dielectric material and then, instead of having leads extend from the components, have exposed metal electrodes at the terminals. The leadless components are generally made in a right parallelpiped configuration and are designed to be directly soldered to soldered pads on the bottom surface of a printed circuit board.

A very significant problem which has been encountered when manufacturing printed circuit boards which had leadless components, is that it is often difficult to adequately secure leadless components to the printed circuit board so they remain in position until the soldering of the leadless components to the circuitry is completed.

The method heretofore most commonly used for securing leadless components to printed circuit boards prior to and during soldering has been to apply a small amount of an adhesive to the positions on the printed circuit board where the leadless components are to be mounted and then place the leadless components in contact with the adhesive so as to bond the leadless components to the surface of the printed circuit board. This technique, however, has met with at best limited success. The adhesives generally form a satisfactory bond with the dielectric material used to encapsulate the leadless components but the bond with the printed circuit board is often at best marginal. The poor bonding of the leadless components to surface of the printed circuit board is believed to be caused by a variety of factors such as the dielectric material of the board not being wet out by the adhesive; the smooth surface of the printed circuit board inhibiting a strong mechanical bond from forming between the leadless components and the board; contaminates such as flux on the surface of the boards and the poor bonding character of certain dielectric material used to make the printed circuit boards. Because of the problem of displacement of leadless components using the prior art methods, it has been necessary to individually examine each printed circuit board assembly after mass soldering and to replace the missing components in a hand soldering operation. The excessive inspection required is highly undesirable and hand soldering is extremely expensive and more prone to cause soldering defects than mass soldering.

Accordingly, what would be highly advantageous would be an improved method for securing leadless components to printed circuit boards so as to prevent or substantially reduce the loss or displacement of leadless components from printed circuit boards prior to and during soldering of the circuit board assemblies.

SUMMARY OF THE INVENTION

In accordance with the present invention a hole is formed through the circuit board at the positions where it is desired to mount leadless components. A hardenable adhesive is then applied where a leadless component is to be mounted. The amount of adhesive which is applied is at least sufficient to form a bond with the dielectric body of the leadless component and also to extend partially into the hole formed in the printed circuit board. The leadless components are then brought into contact with the adhesive so as to form an adhesive plug which is bonded to the dielectric body of the leadless component and also extends into the hole formed in the board. The adhesive is then allowed to harden. The resulting hardened adhesive plug then both mechanically and adhesively holds the leadless components in place through mass soldering.

BRIEF DESCRIPTION OF THE DRAWING

FIG. 1 is an isometric illustration of a typical leadless electronic component.

FIG. 2 is a side view of a printed circuit board assembly having both leaded and leadless components.

FIG. 3 is a top plane view of the circuit board assembly of FIG. 2.

FIG. 4 is a view of the bottom surface of the circuit board assembly of FIG. 2.

DETAILED DESCRIPTION

Figure 5:
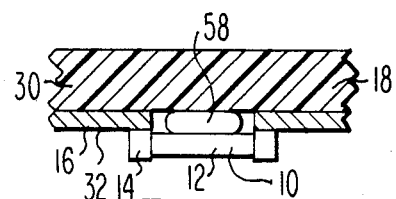
FIG. 5 is an illustration in partial cross section of a leadless component mounted on a printed circuit board in accordance with the teachings of the prior art.

The leadless components 10 which are employed in making the printed circuit board assemblies of the present invention can be conventional in design. In FIG. 1 for example, there is shown a typical leadless component 10 in which the electronic element or elements (not shown) are encapsulated in a dielectric casing 12. At the opposite ends of the leadless component 10 there are formed metal terminals 14 which, as will be pointed in greater detail below, are used for making electrical contact of the leadless component 10 to the circuitry 16 of the circuit board 18 (see FIG. 2).

In FIGS. 2, 3 and 4 are shown a typical printed circuit board assembly 20 which has several different types of electronic components mounted on the circuit board 18. There is shown, for example; a leaded component 22 which has wire leads 24 and a leaded component 26 such as solid state assembly, which has a plurality of pin leads 28 and a leadless component 10 of the type generally illustrated in FIG. 1. The circuit board 18 on which the components 10, 22, 26 are mounted has a dielectric core 30 and a metal foil circuitry 16 formed on the bottom surface 32 of the circuit board 18.

The printed circuit board assemblies 20 include a large number of apertures which are formed through the board for various purposes. For example, there are attachment apertures 34, wire lead apertures 36 for the allowing the wire leads 24 to be inserted through the printed circuit board 18, and pin lead apertures 38 for inserting the pin leads 28 through the circuit board 18.

In FIG. 3 there is shown yet another type of aperture 40 which is used in accordance with this invention for the purpose of mounting a leadless electronic component 10 to the printed circuit board 18. The function of the leadless component aperture 40 will be explained in greater detail hereinafter.

Referring specifically to FIG. 4, there is shown a view of the bottom surface of the board. For purpose of illustration, the circuitry has deliberately been simplified by omitting portions of the circuitry 16 extending from each of the solder pads. It should be noted, however, that with regard to the leaded components 22, 26 that generally circular pads 42, 44 are formed about the point where the leads 24, 28 come through the circuit board 18. After the leaded components 22, 26 are soldered to the circuitry 16 of the circuit board 18, the resulting solder joints 50, 52 will generally be of a somewhat conical configuration. With the leadless components, however, the solder joints 54 are generally of an elongated shape extending along the length of the metal terminals 14 and the generally rectangular solder pads 46 used for the mounting of the leadless component 10 to the printed circuit board 18.

Referring specifically to FIG. 5, there is shown for purposes of explaination of the present invention a leadless component 10 attached to a circuit board 18 by the prior art method. The leadless component 10 is positioned so that its metal terminals 14 are in contact with the circuitry 16 of the printed circuit board 18. An adhesive body 58 is provided between the dielectric casing 12 of the leadless component 10 and the board 18. Under an ideal condition, a bond should be formed between the dielectric casing 12 and the dielectric core 30 of the printed circuit board 18. However, as was pointed out above, in practice this does not always occur. The amount of adhesive has to be carefully monitored so there will be a sufficient amount to form a continuous bond between the dielectric casing 12 of the leadless component and the circuit board 18. Furthermore, considerable difficulty is often encountered in forming a satisfactory bond of the adhesive to the dielectric core 30 of the board 18.

Figure 6:
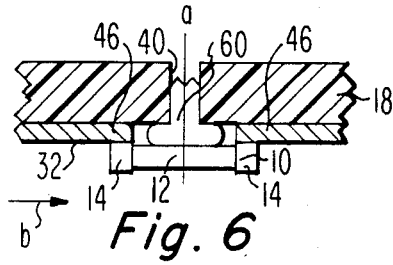
FIG. 6 is an illustration of a leadless component mounted on a printed circuit board assembly in accordance with a first embodiment of the present invention.

In accordance with the present invention, as illustrated in FIG. 6, a substantially improved method is provided for securing a leadless component 10 to the printed circuit board 18. It can be seen in FIG. 6 that an aperture 40 is provided through the circuit board 18, which aperture 40 is located so as to be intermediate between the terminals 14 and in alignment with the dielectric casing 12 of the leadless component 10. The leadless component 10 is positioned on the board 18 with the terminal ends 14 in contact with solder pads 46 of the metal circuitry 16 of the printed circuit board 18. An adhesive plug 60 is formed in the space between the inner surface of the leadless component 10 and the surface of the printed circuit board 18 with the plug 60 extending into the aperture 40 formed in the circuit board 18.

The adhesive plug 60 is formed from a hardenable adhesive composition. Various well known classes of adhesive can be employed for this purpose. The adhesives are selected so as to have good bonding characteristics, particularly with respect to the dielectric material used to make the casing 12 of the leadless component 10. The adhesive should likewise preferably also have good bonding properties with respect to the dielectric core 30 of the printed circuit board 18 but this is not essential because of certain advantages obtained in accordance with the present invention. The adhesives which have been found useful for this purpose include for example epoxies and cyano-acrylates, as well as various other types of high temperature resistant adhesives. The adhesive compositions are generally formulated from a resin, a catalyst to harden the resin, a filler and/or viscosity control agent so that the adhesive will be formable during the application and also sufficiently viscous so as to remain in place once formed at a given location.

Returning to FIG. 6, the adhesive composition used to from the adhesive plug 60 is applied to the printed circuit board 18 between the solder pads 46 for the leadless electronic component 10. The adhesive composition is applied so that as the electronic component 10 is urged into place on the board 18 the adhesive composition will flow into the aperture 40 formed in the board 18.

Once the adhesive composition is in bonding contact with the dielectric casing 12 of the leadless electronic component 10, and a portion of the volume of the adhesive composition has flowed into the aperture 40, the adhesive composition is allowed to harden to form the adhesive plug 60. The leadless component 10 is then firmly secured to the bottom surface 32 of the printed circuit board 12. Even under relatively extreme conditions the electronic component 10 will not be displaced from the circuit board 18. A bond forms between the adhesive plug 60 and the inner surface of the dielectric casing 18 of the electronic component 10. Under ideal conditions the adhesive will also form a strong bond to the exposed surface of the dielectric core 30 of the printed circuit board 18. However, the principal improvement which is obtained in the bonding of leadless components 10 to the circuit board 18 is obtained as a result of the adhesive plug 60 extending upwardly into the aperture 40. It is this improvement which provides the exceptional bond of the leadless component 10 to the circuit board 18.

The aperture 40 in the board is generally punched or drilled, as is conventional in the art, and thus generally, it has a rougher surface than the molded surfaces of the printed circuit board 18. Thus inherently, there will be a better mechanical bond of the adhesive plug 60 to the rougher surface of the aperture 40 as compared to the bottom surface 32 of the printed circuit board. Even more significant, however, the adhesive plug 60 which is formed has its principle axis, a, normal to the direction of the forces which are encountered in the wave soldering of circuit boards as indicated by the arrow b. For this reason the adhesive plug 60 significantly improves the strength of the bond of the leadless component 10 to the bottom surface 32 of the printed circuit board 18 as compared to when the leadless component 10 is simply bonded to the surface of the board as shown in FIG. 5.

Figure 7:
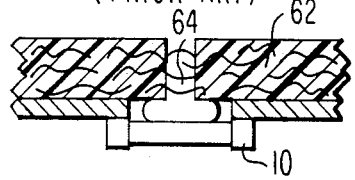
FIG. 7 is an illustration of an additional embodiment of the present invention.

In order to even further improve the bond of a leadless component 10 to a printed circuit board 18 it is preferable to use a printed circuit board in which the dielectric core 30 of the circuit board 18 is reinforced with a fibrous material such as fiber glass mat or fabric. As shown in FIG. 7, when an aperture is drilled or punched through the fiber reinforced circuit boards 62, the fibers 64 of the reinforcement will extend inwardly into the aperture 40 formed in the fiber reinforced printed circuit board 62. Thereafter, when the adhesive plug 60 is formed in the aperture 40, the fibers will extend inwardly into the adhesive plug 60 and form an even stronger mechanical bond with the adhesive plug 60 so as to further strengthen both the plug 60 itself and the bonding of the leadless component 10 to the circuit boards 18.

Figure 8:
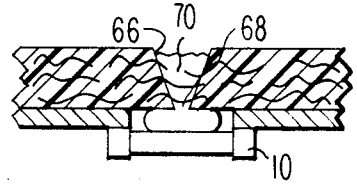
FIG. 8 is an illustration of a still further alternate embodiment of the present invention.

In the most preferred embodiment of this invention, as shown in FIG. 8, the aperture through the board 18 is formed in a truncated conical shape so as to have a narrower opening 68 adjacent the leadless component 10 which extends outwardly towards the upper surface of the printed circuit board. The technique for forming such a hole will be explained below. It should be noted that in this particular embodiment the adhesive plug 70 is formed in the aperture 66 also with a conically shaped upper portion which securely mechanically locks the entire plug 70 in place so that during the further processing of the printed circuit board 18 the plug 70 can not be readily dislodged. This technique can be further improved as noted above by using a fiber reinforced dielectric core so that the fibers extend into the plug 70 in similar manner to that shown in FIG. 7.

Various methods can be used to attach leadless components to the circuit boards in accordance with the teachings of this invention. The simplest and most straightforward technique is to drill holes through the circuit board to provide substantially cylindrical apertures 40 through the board of the type shown in FIGS. 6 and 7. The adhesive composition can then be applied to the surface of the printed circuit board 18 between the solder pads and thereafter the leadless electronic component 10 pressed into place so as to force a portion of the adhesive composition into the aperture 40. Thereafter the adhesive can be cured either by catalytic action at ambient temperatures, by the application of heat or by other well known conventional techniques to form a solidified adhesive plug 60 to hold the leadless component 10 in place.

Figure 9:
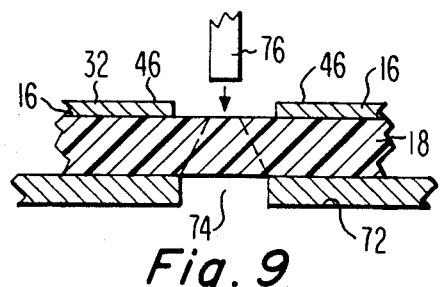
FIGS. 9, 10, 11, and 12, taken together, sequentially illustrate a first method of practicing the method of the present invention.
Figure 10:
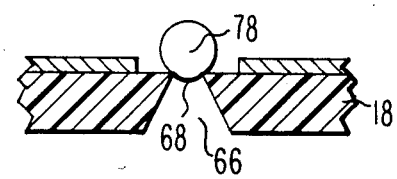
Figure 11:
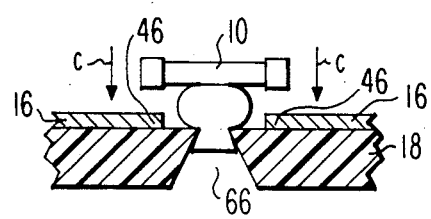
Figure 12:
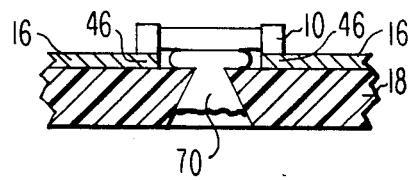

The preferred method of manufacturing the circuit board assembly of this invention, however, is to use truncated conical apertures 66 as shown in FIG. 8. The method for forming a truncated conical aperture 66 and for attaching a leadless component 10 to the surface of a circuit board 18 is illustrated in FIGS. 9-11. The circuit board 18 is positioned on an anvil 72 which has an enlarged aperture 74 defined therein. The circuit board 18 is placed on top of the anvil 72 with the bottom surfaces 32, that is the surface having the circuitry 16, being in the upward position as shown in FIG. 9. A punch 76 is thereafter positioned over the location wherein it is desired to provide the truncated conical aperture 66. The diameter of the punch 76 is less than that of the aperture 74 defined in the anvil 72. The punch 76 is driven through the circuit board 18. Because of the difference in diameter of the punch 76 and the enlarged diameter of the aperture 74 in the anvil 72, an aperture 66 with a truncated conical shape as indicated by the dotted lines on FIG. 9 is formed in the printed circuit board 18. Thereafter, a measured amount of an adhesive composition 78 is placed on the circuit board 18 over the narrow opening 68 of the truncated conical aperture 66. The leadless electronic component 10 is then forced in a downward direction as indicated by the arrows c towards the surface of the circuit board 18 which forces the relatively viscous adhesive composition into the conically shaped aperture 66. A bond is formed with the dielectric casing 12 of the leadless electronic component 10 and plug 70 with a conical shaped portion conforming to the aperture formed in the circuit board as shown in FIG. 12.

Figure 13:
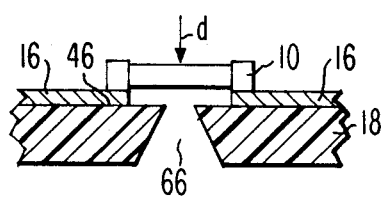
FIGS. 13, 14, and 15 taken together sequentially illustrate an alternate method of practicing the method of the invention.
Figure 14:
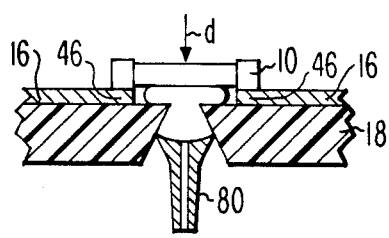
Figure 15:
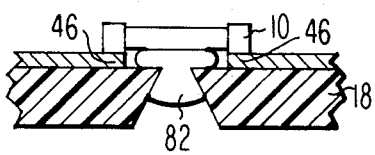

An alternate method of preparing the circuit board assemblies 20 according to the preferred method of the present invention is illustrated in FIGS. 13-15 of the drawing. The conical aperture 66 is formed in the circuit board 18 by the technique heretofore described with respect to FIG. 9. Thereafter, a leadless electronic component 10 is positioned over the aperture 60 in the proper position with the terminals 14 in contact with the solder pads 56. Pressure is applied in the direction indicated by the arrow, d, so as to hold the leadless component 10 in place. Thereafter, an injection nozzle 80 is inserted into the conical aperture 66 as indicated in FIG. 14. A predetermined measured amount of an adhesive composition is inserted into the cavity formed between the leadless electronic component 10 and the conical aperture 66 of the circuit board 18 so as to form a conically shaped adhesive plug 82 as indicated in FIG. 15.

It should be appreciated other techniques may likewise be employed for forming the adhesive plugs. The critical feature of the invention is the formation of an adhesive plug with a portion extending into the circuit board so as to form a mechanical lock to improve the bond of leadless electronic component to the surface of the printed circuit boards.

In practice, it has been found that the method of this invention is extremely successful. Even circuit boards made of, for example, polytetrafluoroethylene, which heretofore have been extremely difficult to utilize with leadless electronic components because of the inherent non-bonding properties of polytetrafluoroethylene, can now readily be used with leadless components using the method of the present invention. Furthermore, it has been found that no substantial problems are encountered with regard to displacement or loss of the leadless electronic components in mass soldering processes so that the requirements for extensive inspection and resoldering are substantially eliminated using the method of the present invention.

What is claimed is:

1. In the method for soldering a leadless electronic component having a central portion and terminal end portions to a printed circuit board having solder pads separated by a predetermined width space wherein the leadless electronic component is initially adhesively secured to the printed circuit board with the terminal end portions in alignment with the solder pads and the resulting assembly is thereafter soldered, the improvement which comprises:

(a) forming an aperture through the printed circuit board at a location which is intermediate between the solder pads;
   (b) applying a predetermined amount of a hardenable adhesive at about said location, said predetermined amount being sufficient to form an adhesive body extending from the central portion of a leadless electronic component positioned on said printed circuit board to a point substantially within the aperture formed in the printed circuit board but less than an amount which will allow the adhesive to contact the terminal end portions and solder pads;
   (c) positioning said leadless electronic component on the printed circuit board whereby only the central portion of the leadless electronic component is contacted by the adhesive, and the adhesive extends to a point substantially within the aperture; and
   (d) allowing the adhesive to harden whereby a hardened adhesive body is obtained which secures the leadless electronic component in position prior to and during soldering of the terminal end portions to the solder pads.

2. The method according to claim 1 wherein the aperture formed in said printed circuit board is formed in a truncated conical configuration with said aperture having an increasing diameter extending from the space between the solder pads to the opposite surface of said printed circuit board.

3. The method according to claim 1 wherein the leadless electronic component is initially positioned on the solder pads of the printed circuit board and thereafter the predetermined amount of adhesive is applied through the aperture from the side of the board opposite to that on which the leadless electronic component is held in place.

* * * * *